(12) United States Patent
Yen et al.

(10) Patent No.: US 12,009,258 B2
(45) Date of Patent: Jun. 11, 2024

(54) SELF-ALIGNED INTERCONNECT WITH PROTECTION LAYER

(71) Applicant: Taiwan Semiconductor Manufacturing Co., Ltd., Hsinchu (TW)

(72) Inventors: Yu-Chan Yen, Taipei (TW); Ching-Feng Fu, Taichung (TW); Chia-Ying Lee, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 184 days.

(21) Appl. No.: 17/227,056

(22) Filed: Apr. 9, 2021

(65) Prior Publication Data

US 2021/0225707 A1 Jul. 22, 2021

Related U.S. Application Data

(62) Division of application No. 14/302,616, filed on Jun. 12, 2014, now Pat. No. 10,998,228.

(51) Int. Cl.
*H01L 27/12* (2006.01)
*H01L 21/768* (2006.01)
(Continued)

(52) U.S. Cl.
CPC .. *H01L 21/76897* (2013.01); *H01L 21/76802* (2013.01); *H01L 21/76805* (2013.01);
(Continued)

(58) Field of Classification Search
CPC ....... H01L 21/76841–76876; H01L 23/53223; H01L 23/53238; H01L 23/53252; H01L 23/53266; H01L 2221/1073–1089; H01L 21/02362; H01L 23/5329–53295; H01L 21/76801–76837; H01L 21/76802–76817; H01L 21/76877–76883; H01L 21/76831; H01L 21/7684; H01L 21/76832; H01L 21/76886; H01L 21/76805; H01L 21/7682; H01L 21/76858; H01L 21/76849; H01L 21/7685;
(Continued)

(56) References Cited

U.S. PATENT DOCUMENTS 6,033,584 A 3/2000 Ngo et al.
6,124,192 A 9/2000 Jeng et al.
(Continued)

FOREIGN PATENT DOCUMENTS

CN 1248059 A 3/2000
CN 101292348 A 10/2008
(Continued)

*Primary Examiner* — Mary A Wilczewski
*Assistant Examiner* — Tsz K Chiu
(74) *Attorney, Agent, or Firm* — Slater Matsil, LLP

(57) ABSTRACT

An integrated circuit structure includes a first Inter-Layer Dielectric (ILD), a gate stack in the first ILD, a second ILD over the first ILD, a contact plug in the second ILD, and a dielectric protection layer on opposite sides of, and in contact with, the contact plug. The contact plug and the dielectric protection layer are in the second ILD. A dielectric capping layer is over and in contact with the contact plug.

20 Claims, 14 Drawing Sheets

(51) Int. Cl.
*H01L 21/8234* (2006.01)
*H01L 23/485* (2006.01)
*H01L 23/522* (2006.01)
*H01L 29/66* (2006.01)
*H01L 23/532* (2006.01)
*H01L 29/165* (2006.01)

(52) U.S. Cl.
CPC .. *H01L 21/76831* (2013.01); *H01L 21/76832* (2013.01); *H01L 21/76834* (2013.01); *H01L 21/76846* (2013.01); *H01L 21/76849* (2013.01); *H01L 21/7685* (2013.01); *H01L 21/76877* (2013.01); *H01L 21/76895* (2013.01); *H01L 21/823475* (2013.01); *H01L 23/485* (2013.01); *H01L 23/5226* (2013.01); *H01L 23/53295* (2013.01); *H01L 29/165* (2013.01); *H01L 29/665* (2013.01); *H01L 29/66545* (2013.01); *H01L 29/66636* (2013.01); *H01L 2924/0002* (2013.01)

(58) Field of Classification Search
CPC ......... H01L 21/76834; H01L 21/76864; H01L 21/76856; H01L 21/76846; H01L 29/165; H01L 29/665; H01L 29/66545; H01L 29/66636; H01L 2924/0002; H01L 29/7812
See application file for complete search history.

(56) References Cited

U.S. PATENT DOCUMENTS

| | | | |
|---|---|---|---|
| 6,348,411 B1 | 2/2002 | Ireland et al. | |
| 6,627,528 B1 | 9/2003 | Ishimaru | |
| 6,784,552 B2 | 8/2004 | Nulty et al. | |
| 7,034,354 B2 * | 4/2006 | Lee | H01L 21/28061 257/E21.507 |
| 7,573,132 B2 | 8/2009 | Chung et al. | |
| 7,723,759 B2 | 5/2010 | Baskaran et al. | |
| 7,737,022 B2 | 6/2010 | Mathew et al. | |
| 7,745,327 B2 * | 6/2010 | Preusse | H01L 21/76846 438/653 |
| 8,129,235 B2 | 3/2012 | Chou et al. | |
| 8,338,254 B2 | 12/2012 | Park et al. | |
| 8,431,933 B2 | 4/2013 | Lee et al. | |
| 8,581,348 B2 | 11/2013 | Rashed et al. | |
| 8,921,947 B1 * | 12/2014 | Hung | H01L 23/485 257/390 |
| 8,962,464 B1 * | 2/2015 | Chang | H01L 21/823437 438/588 |
| 8,993,433 B2 | 3/2015 | Chen et al. | |
| 9,070,711 B2 * | 6/2015 | Xie | H01L 23/53295 |
| 9,379,058 B2 | 6/2016 | Song et al. | |
| 9,865,736 B2 | 1/2018 | Chang et al. | |
| 9,985,123 B2 * | 5/2018 | Lu | H01L 21/76897 |
| 10,026,824 B1 * | 7/2018 | Chanemougame | H01L 21/845 |
| 10,056,353 B2 * | 8/2018 | Tsai | H01L 21/76898 |
| 10,062,763 B2 * | 8/2018 | Bao | H01L 21/823431 |
| 10,170,377 B1 * | 1/2019 | Zang | H10B 10/00 |
| 10,199,263 B2 * | 2/2019 | Jang | H01L 21/76877 |
| 10,347,726 B2 * | 7/2019 | Bae | H01L 27/0886 |
| 10,497,649 B2 | 12/2019 | Bark et al. | |
| 10,707,131 B2 | 7/2020 | Lim et al. | |
| 2002/0025669 A1 * | 2/2002 | Hwang | H01L 21/76897 257/E21.507 |
| 2002/0168830 A1 | 11/2002 | DeBoer et al. | |
| 2003/0011023 A1 | 1/2003 | Hurley | |
| 2003/0215997 A1 | 11/2003 | Hachisuka et al. | |
| 2004/0014278 A1 | 1/2004 | Lee et al. | |
| 2004/0076068 A1 | 4/2004 | Yamada et al. | |
| 2004/0173912 A1 | 9/2004 | Rhodes | |
| 2005/0006691 A1 | 1/2005 | Wu et al. | |
| 2005/0014311 A1 | 1/2005 | Hayasaka et al. | |
| 2005/0085072 A1 * | 4/2005 | Kim | H01L 21/76897 257/E21.507 |
| 2005/0142756 A1 * | 6/2005 | Park | H01L 21/76895 257/E21.59 |
| 2005/0239282 A1 * | 10/2005 | Chen | H01L 21/76897 257/E21.507 |
| 2005/0277258 A1 * | 12/2005 | Huang | H10B 99/00 257/E21.627 |
| 2006/0263985 A1 * | 11/2006 | Kang | H01L 27/10888 438/275 |
| 2008/0124847 A1 * | 5/2008 | Sudo | H01L 27/1207 257/E21.703 |
| 2008/0230917 A1 | 9/2008 | Chou et al. | |
| 2010/0213572 A1 | 8/2010 | Ching et al. | |
| 2010/0314768 A1 | 12/2010 | Darnon et al. | |
| 2011/0108930 A1 * | 5/2011 | Cheng | H01L 29/42364 257/E21.44 |
| 2011/0140238 A1 | 6/2011 | Natori et al. | |
| 2012/0098070 A1 * | 4/2012 | Wang | H01L 29/78 257/E21.409 |
| 2012/0211837 A1 | 8/2012 | Baars et al. | |
| 2013/0043516 A1 * | 2/2013 | Han | H01L 21/76802 438/720 |
| 2013/0175583 A1 | 7/2013 | Yuan et al. | |
| 2013/0196496 A1 | 8/2013 | Yeh et al. | |
| 2013/0277764 A1 * | 10/2013 | Li | H01L 21/0228 257/E21.409 |
| 2014/0138750 A1 | 5/2014 | Wu et al. | |
| 2014/0199837 A1 | 7/2014 | Hung et al. | |
| 2014/0284671 A1 * | 9/2014 | Hung | H01L 21/76877 257/296 |
| 2015/0332962 A1 * | 11/2015 | Chen | H01L 21/76895 438/653 |
| 2016/0133623 A1 * | 5/2016 | Xie | H01L 23/528 438/586 |
| 2018/0308797 A1 * | 10/2018 | Tsai | H01L 29/41766 |

FOREIGN PATENT DOCUMENTS

| | | |
|---|---|---|
| DE | 102012219376 | 6/2013 |
| KR | 1020090069857 A | 1/2009 |
| KR | 1020120065113 A | 6/2012 |

* cited by examiner

SELF-ALIGNED INTERCONNECT WITH PROTECTION LAYER

CROSS REFERENCES TO RELATED APPLICATIONS

This application is a divisional application of U.S. application Ser. No. 14/302,616, filed on Jun. 12, 2014 and entitled "Self-Aligned Interconnect with Protection Layer," which application is hereby incorporated herein by reference.

BACKGROUND

With the evolving of the manufacturing technology of integrated circuits, integrated circuit devices become increasingly smaller. The integrated circuits are interconnected by conductive features such as metal lines, vias, and contact plugs to form functional circuits. As a result, the spacing between the conductive features also becomes smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
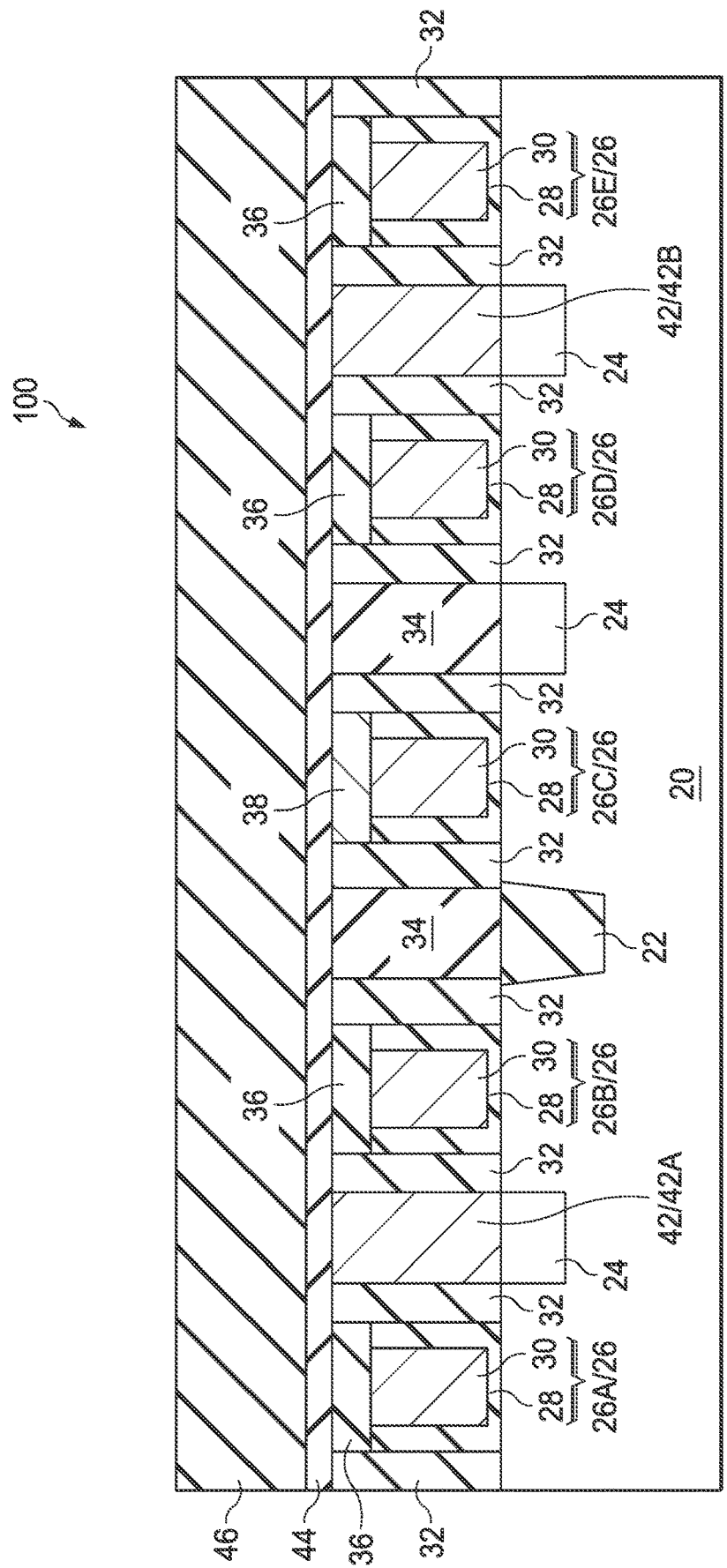
FIGS. 1 through 12 illustrate the cross-sectional views of intermediate stages in the formation of an interconnect structure including contact plugs in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An interconnect structure including contact plugs and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 14:
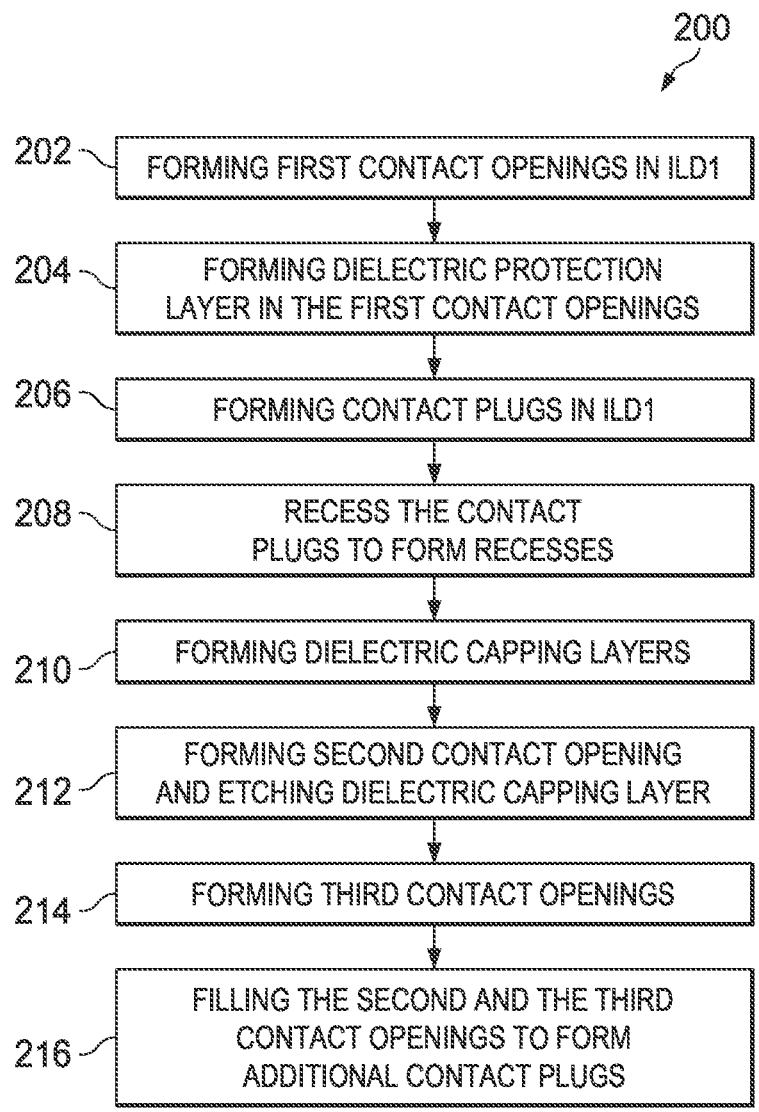
FIG. 14 illustrates a process flow for forming an interconnect structure in accordance with some embodiments.

FIGS. 1 through 12 illustrate the cross-sectional views of intermediate stages in the formation of an interconnect structure in accordance with some embodiments. The steps shown in FIGS. 1 through 12 are also illustrated schematically in the process flow 200 as shown in FIG. 14. In the subsequent discussion, the process steps in FIGS. 1 through 12 are discussed referring to the process steps in FIG. 14.

FIG. 1 illustrates wafer 100, which includes semiconductor substrate 20 and the features formed at a top surface of semiconductor substrate 20. In accordance with some embodiments, semiconductor substrate 20 comprises crystalline silicon, crystalline germanium, silicon germanium, a III-V compound semiconductor, and/or the like. Semiconductor substrate 20 may also be a bulk silicon substrate or a Silicon-On-Insulator (SOI) substrate. Shallow Trench Isolation (STI) region(s) 22 may be formed in semiconductor substrate 20 to isolate the active regions in semiconductor substrate 20.

A plurality of gate stacks 26 (including 26A, 26B, 26C, 26D, and 26E) are formed over semiconductor substrate 20. In accordance with some embodiments, gate stacks 26 are replacement gates that are formed by forming dummy gate stacks (not shown) and then replacing the dummy gate stacks with replacement gates. Accordingly, each of the gate stacks 26 includes gate dielectric 28 and gate electrode 30 over gate dielectric 28. Gate dielectrics 28 further include bottom portions underlying the respective gate electrodes 30, and sidewall portions on the sidewalls of the respective gate electrodes 30. In accordance with some embodiments of the present disclosure, gate dielectrics 28 comprise silicon oxide, silicon nitride, a high-k dielectric material such as hafnium oxide, lanthanum oxide, aluminum oxide, combinations thereof, and/or multi-layers thereof. Gate electrodes 30 may be metal gates including, for example, TiAl, cobalt, aluminum, titanium nitride, tantalum nitride, etc, and may include multiple layers of different materials. Depending on whether the respective transistors including the gate electrodes 30 are P-type Metal-Oxide-Semiconductor (PMOS) transistors or N-type Metal-Oxide-Semiconductor (NMOS) transistors, the materials of gate electrodes 30 are selected to have work functions suitable for the respective MOS transistors. Gate spacers 32 are formed on the sidewalls of gate stacks 26. Gate spacers 32 may include silicon oxide, silicon nitride, etc.

As shown in FIG. 1, some of gate stacks such as gate stacks 26A, 26B, 26D, and 26E, are covered by dielectric layers 36. These portions of gate stacks may act as routing lines, and may form transistors in the plane shown by FIG. 1, or in the planes not illustrated in FIG. 1. In accordance with some embodiments, dielectric layers 36 comprise a dielectric material such as silicon oxide, silicon nitride, silicon carbide, silicon oxynitride, or the like. Other gate stacks, such as gate stack 26C, are covered by conductive layers 38. It is appreciated that gate stack 26C may also have dielectric layers 36 formed thereon, with conductive layer 38 formed in an opening of the respective overlying dielectric layers 36. However, since the dielectric layer 36 overlapping gate stack 26C is not in the same plane as illustrated in FIG. 1, the respective dielectric layer 36 is not shown in FIG. 1.

Inter-Layer Dielectric (ILD) 34 is formed over semiconductor substrate 20, and fills the space between gate stacks 26 and gate spacers 32. Hence, ILD 34 and gate stacks 26 are formed at a same level. Throughout the description, ILD 34 is also referred to as ILD0 34. In some exemplary embodiments, ILD0 34 comprises phosphosilicate glass (PSG), borosilicate glass (BSG), boron-doped phosphosilicate glass (BPSG), fluorine-doped silicate glass (FSG), tetraethyl orthosilicate (TEOS), or the like.

Source and drain regions (referred to as source/drain regions hereinafter) 24 of MOS transistors are formed in semiconductor substrate 20. In accordance with some embodiments, source/drain regions 24 include a p-type or an n-type impurity, depending on whether the respective transistor is a P-type MOS transistor or an n-type MOS transistor. Source/drain regions 24 may include SiP when the respective transistor is an n-type MOS transistor, or SiGe when the respective transistor is a p-type MOS transistor. The formation of source/drain regions 24 may include forming recesses in semiconductor substrate 20, and epitaxially growing the source/drain regions 24 in the recesses. In some exemplary embodiments, gate stack 26D and the source/drain regions 24 on the opposite sides of gate stack 26D form a transistor.

Source/drain contact plugs 42 (including 42A and 42B) are formed in ILD0 34. The top surfaces of source/drain contact plugs 42 may be coplanar or substantially coplanar with the top surface of dielectric layers 36 and ILD0 34. Although FIG. 1 schematically illustrates that source/drain contact plugs 42 are in contact with gate spacers 32, source/drain contact plugs 42 may be spaced apart from gate spacers 32 by ILD0 34. In accordance with some embodiments, source/drain contact plugs 42 are formed of tungsten, copper, aluminum, or alloys thereof. Source/drain contact plugs 42 may also include an adhesion/barrier layer (not shown) formed of titanium, titanium nitride, tantalum, tantalum nitride, or the like. Source/drain contact plugs 42 are electrically coupled to the respective underlying source/drain regions 24. Source/drain silicide regions (not shown) may be formed between, and in contact with, source/drain regions 24 and the respective overlying source/drain contact plugs 42A and 42B.

Figure 13:
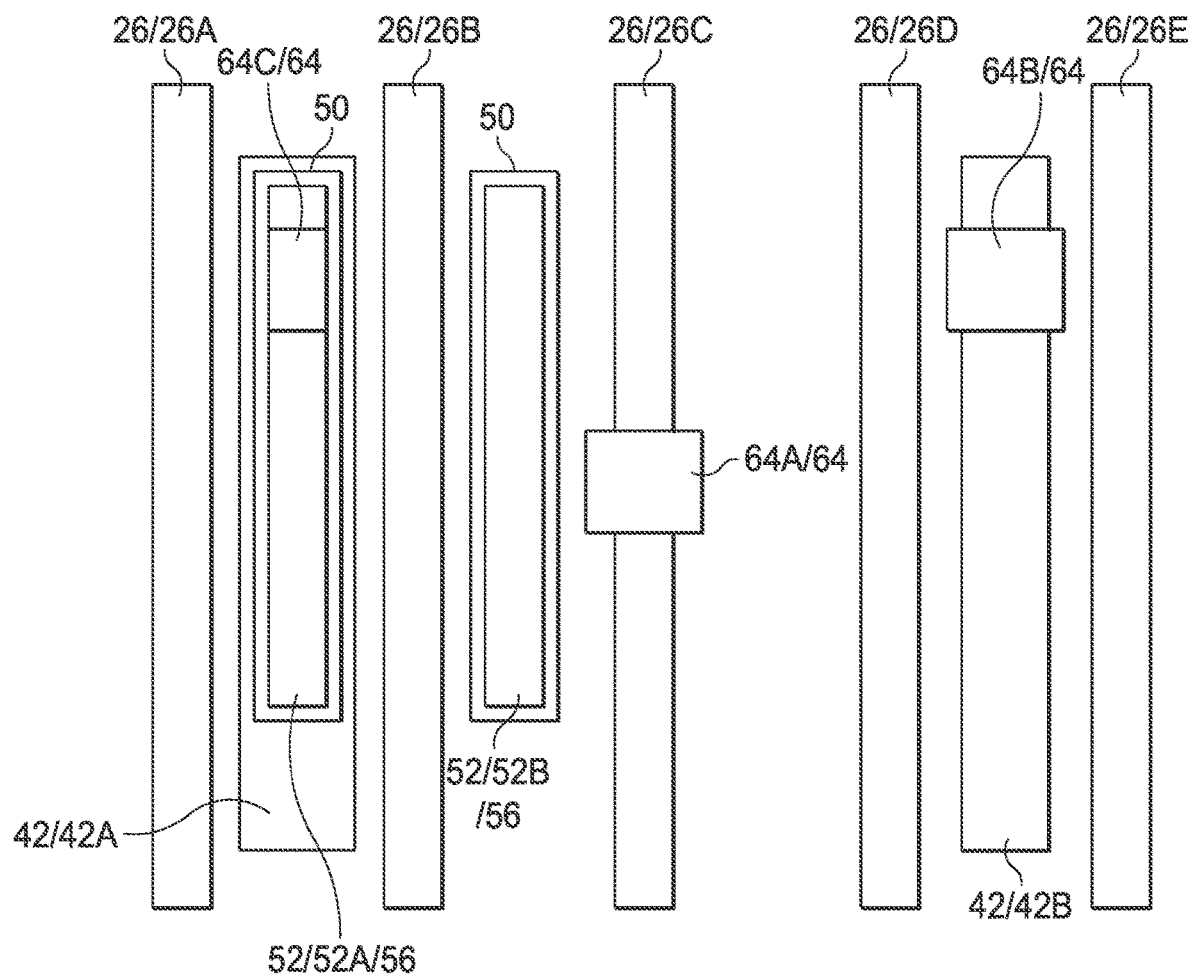
FIG. 13 illustrates a top view of the contact plugs in accordance with some embodiments.

FIG. 13 illustrates a top view of the structure including gate stacks 26 and source/drain contact plugs 42A and 42B in accordance with some embodiments. In the illustrated embodiments, gate stacks 26 are formed as strips parallel to each other. The parallel gate stacks 26 may have a uniform pitch and a uniform spacing. Source/drain contact plugs 42A and 42B are illustrated as slot contact plugs that are strips with lengths significantly greater than the respective widths. The slot contact plugs may also be used as routing lines in addition to the function of connecting to the source and drain regions 24 (FIG. 1). In alternative embodiments, in the top view, source/drain contact plugs 42A and 42B may also have lengths and widths close to each other.

Referring to back to the process step shown in FIG. 1, etch stop layer 44 is formed over gate stacks 26, source/drain contact plugs 42, and ILD0 34. Etch stop layer 44 may comprise silicon carbide, silicon oxynitride, silicon carbonitride, or the like. ILD 46 (referred to as ILD1 46 hereinafter) is formed over etch stop layer 44. In accordance with some embodiments, ILD1 46 comprises a material selected from PSG, BSG, PBSG, FSG, TEOS, or other non-porous low-k dielectric materials. ILD1 46 and ILD0 34 may be formed of a same material or different materials, and may be selected from the same group of candidate materials. ILD1 46 may be formed using spin coating, Flowable Chemical Vapor Deposition (FCVD), or the like. In alternative embodiments of the present disclosure, ILD1 46 is formed using a deposition method such as Plasma Enhanced Chemical Vapor Deposition (PECVD), Low Pressure Chemical Vapor Deposition (LPCVD), or the like.

Figure 2:
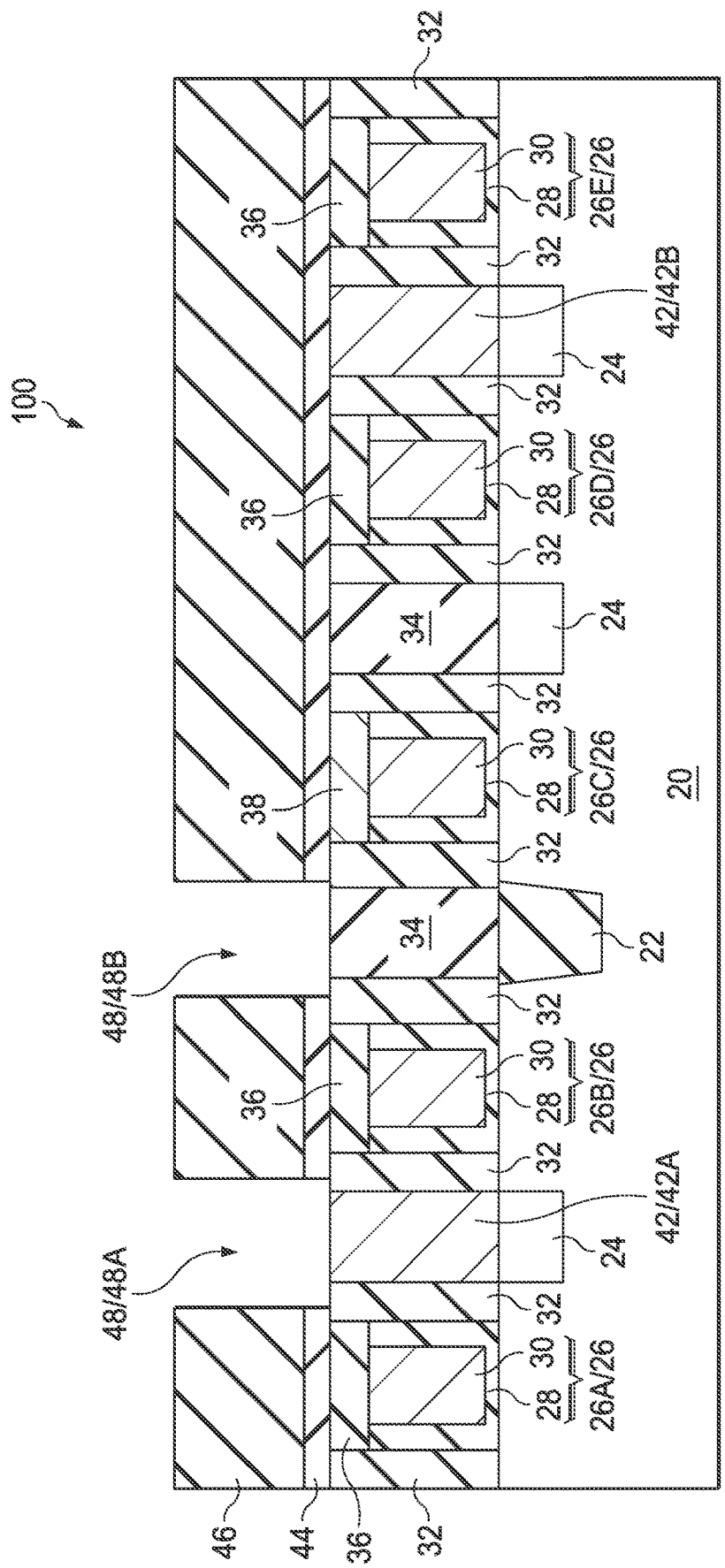

Referring to the process step shown in FIG. 2 (step 202 in the process flow in FIG. 14), ILD1 46 and etch stop layer 44 are etched to form contact openings 48 (including 48A and 48B). The etching is performed using, for example, Reactive Ion Etch (RIE). After the etching process, contact plugs 42A and ILD0 34 are exposed to contact openings 48A and 48B, respectively. The etching may be anisotropic, so that the sidewalls of contact openings 48 are substantially vertical.

Figure 3:
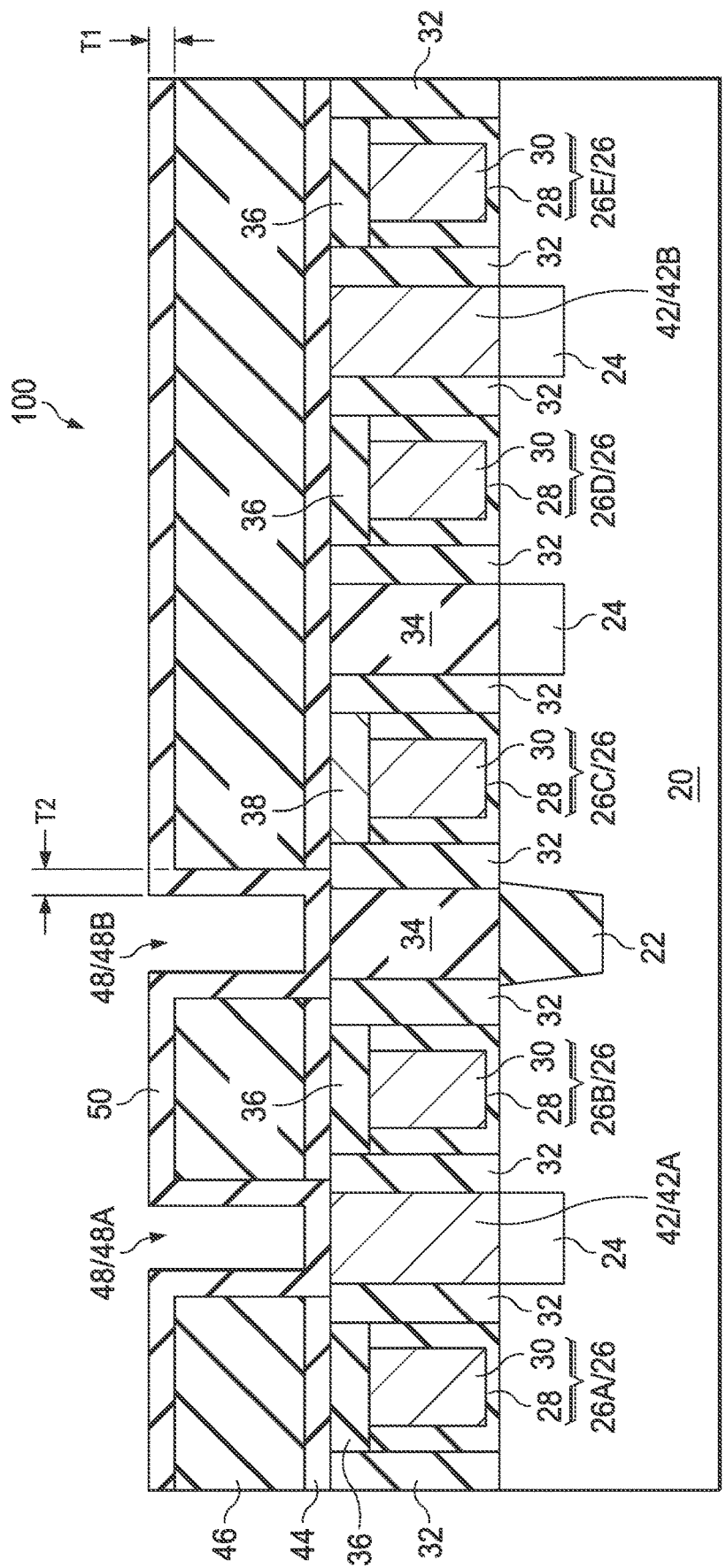

Next, referring to the process step shown in FIG. 3 (step 204 in the process flow in FIG. 14), dielectric protection layer 50 is formed. In accordance with some embodiments, dielectric protection layer 50 comprises a dielectric material selected from SiN, SiON, SiCN, SiOCN, AlON, AlN, combinations thereof, and/or multi-layers thereof. The thicknesses T1 and T2 of dielectric protection layer 50 may be in the range between about 3 nm and about 10 nm. It is appreciated, however, that the values recited throughout the description are merely examples, and may be changed to different values.

In accordance with some embodiments of the present disclosure, dielectric protection layer 50 is formed using PECVD, Plasma Enhanced Atomic Layer Deposition (PEALD), Atomic Layer Deposition (ALD), High Density Plasma Chemical Vapor Deposition (HDP CVD), or similar methods.

Dielectric protection layer 50 may be a conformal layer whose horizontal portions' thickness T1 and vertical portions' thickness T2 are similar to each other. For example, the difference |T1−T2| may be smaller than about 20 percent, or smaller than about 10 percent, of both thicknesses T1 and T2. Dielectric protection layer 50 includes some portions over ILD1 46 and other portions extending into contact openings 48A and 48B. Furthermore, dielectric protection layer 50 covers the bottoms of contact openings 48A and 48B.

Figure 4:
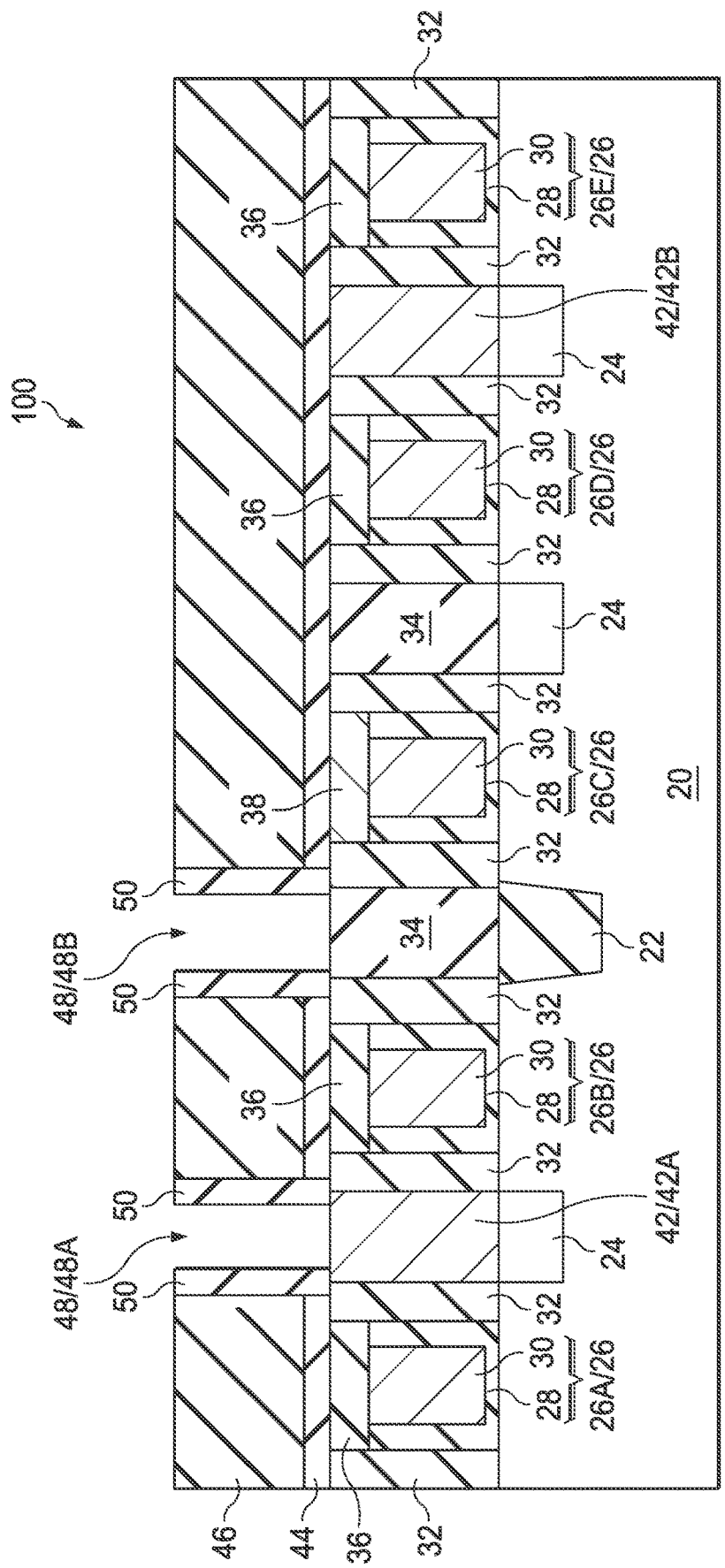

Next, referring to the process step shown in FIG. 4 (also step 204 in the process flow in FIG. 14), an etching step is performed using, for example, dry etch. The horizontal portions of dielectric protection layer 50 are removed, and the vertical portions of dielectric protection layer 50 in contact opening 48 are left. In the top view of the structure in FIG. 4, the remaining dielectric protection layer 50 may form full rings, each encircling one of contact openings 48A and 48B (FIG. 13). The portions of dielectric protection layer 50 at the bottoms of contact openings 48A and 48B are removed, and hence source/drain contact plug 42A and ILD0 34 are exposed to the respective contact openings 48A and 48B again.

Figure 5:
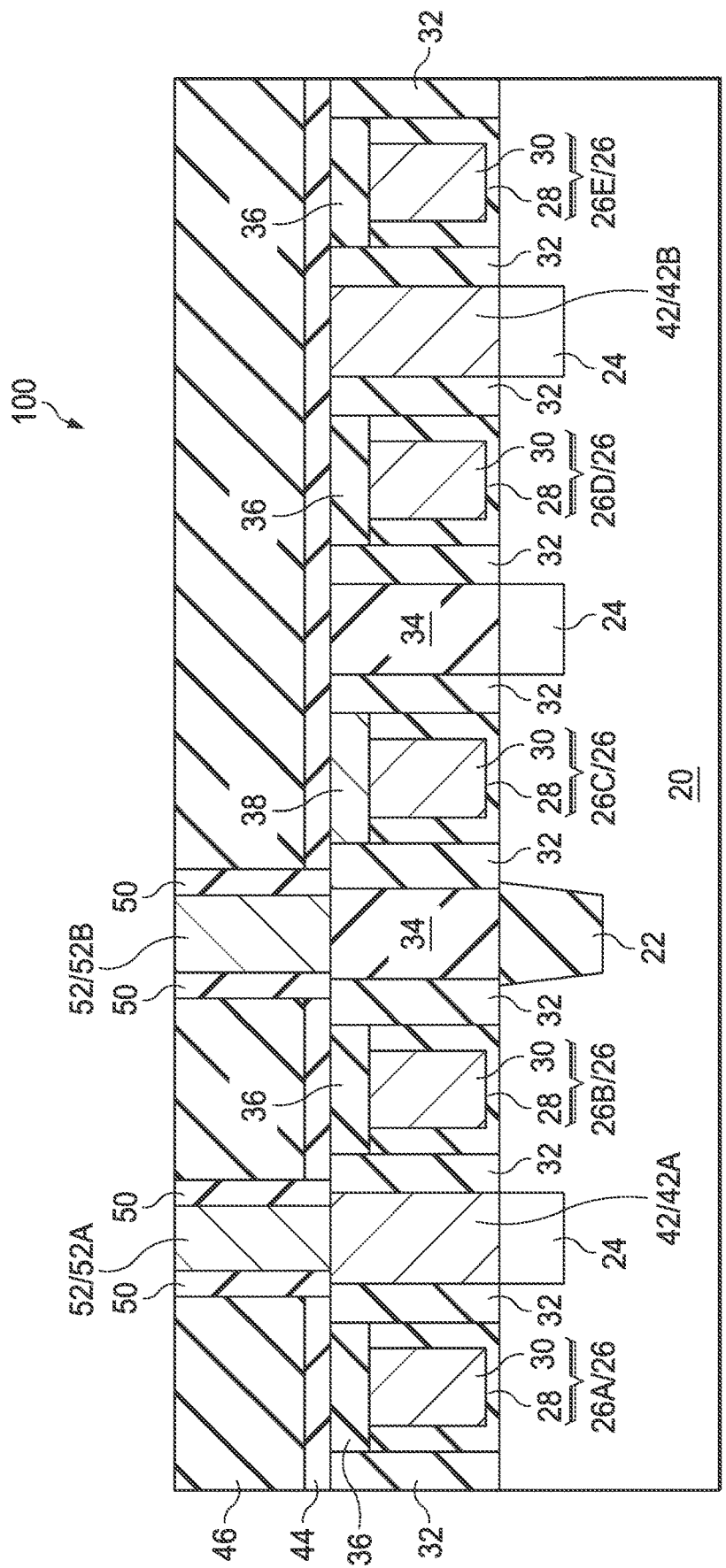

Referring to the process step shown in FIG. 5 (step 206 in the process flow in FIG. 14), contact plugs 52 (including 52A and 52B) are formed in contact openings 48A and 48B (FIG. 4), respectively. In accordance with some embodiments of the present disclosure, contact plugs 52 are formed of a material selected from tungsten, aluminum, copper, titanium, tantalum, titanium nitride, tantalum nitride, alloys therefore, and/or multi-layers thereof. The formation of contact plugs 52 may include filling a conductive material(s) into contact openings 48A and 48B (FIG. 4), until the conductive material fills the entireties of contact openings 48A and 48B, and performing a planarization (such as Chemical Mechanical Polish (CMP)) to level the top surfaces of contact plugs 52 with the top surface of ILD1 46. In the resulting structure, dielectric protection layer 50 forms full rings encircling each of contact plugs 52, as shown in the top view in FIG. 13.

In accordance with some embodiments, as shown in FIG. 13, the widths and the lengths of contact plugs 52A may be the same as or different from the widths and the lengths of the underlying contact plug 42A. Furthermore, since contact plugs 52A and 42A are formed in different process steps, contact plugs 52A and 42A can be distinguished from each other.

Figure 6:
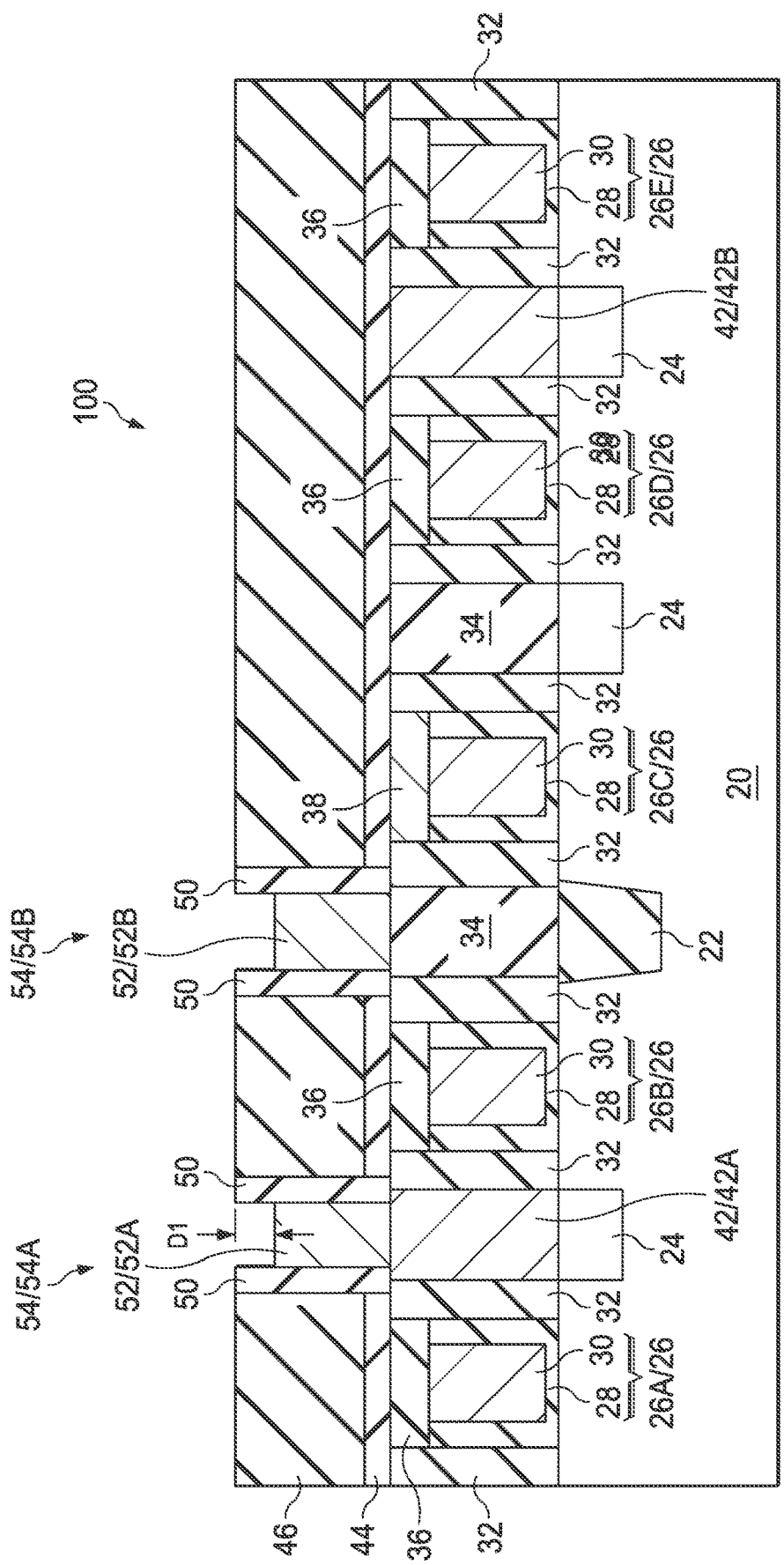

Next, as shown in the process step shown in FIG. 6 (step 208 in the process flow in FIG. 14), in accordance with some embodiments of the present disclosure, contact plugs 52A and 52B are etched back, forming recesses 54 (including 54A and 54B) in ILD1 46. The depth D1 of recesses 54A and 54B is greater than about 5 nm, and may be in the range between about 5 nm and about 20 nm.

Figure 7:
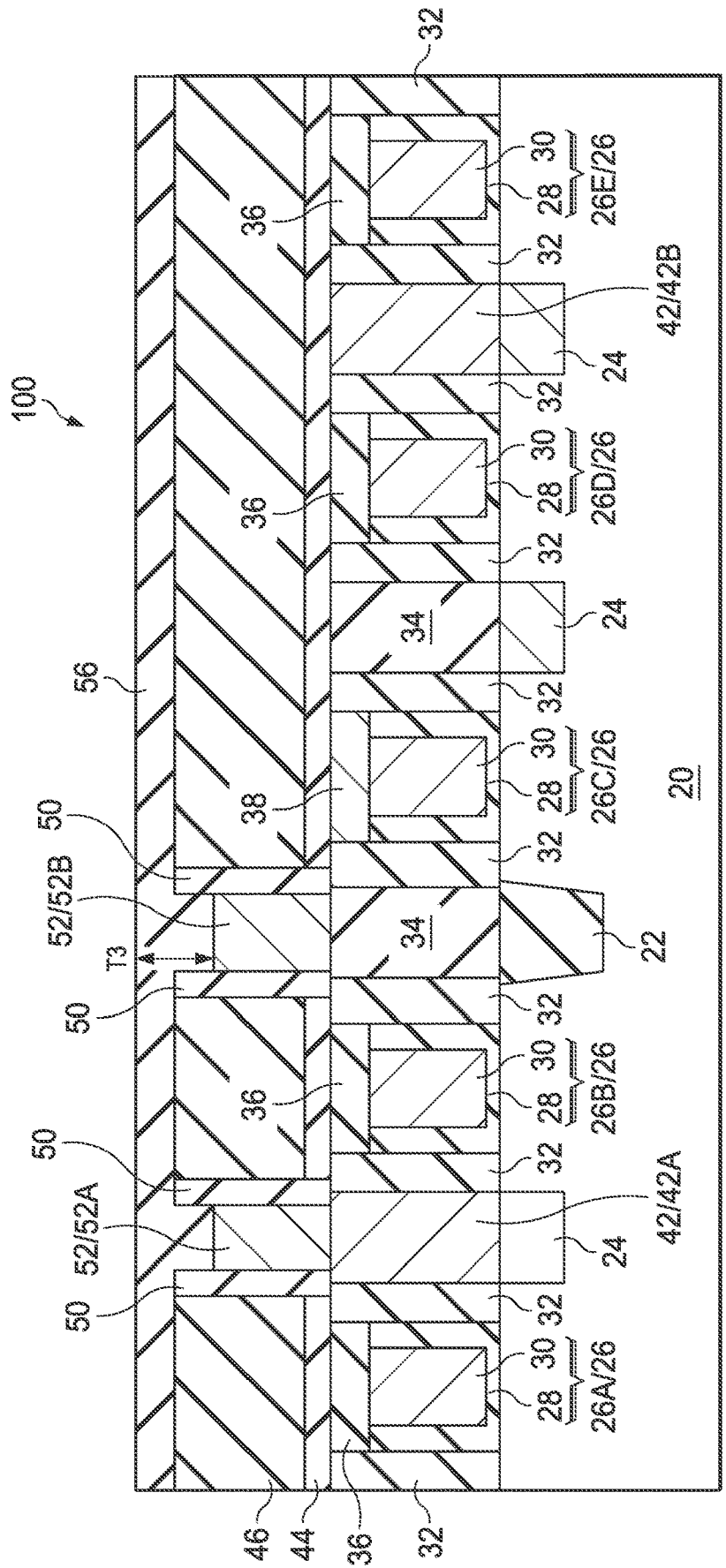

FIG. 7 illustrates the deposition of dielectric capping layer 56 (step 210 in the process flow in FIG. 14). In accordance with some embodiments, dielectric capping layer 56 fully fills recesses 54A and 54B (FIG. 6), and the top surface of dielectric capping layer 56 is higher than the top surface of ILD1 46. Accordingly, thickness T3 of dielectric capping layer 56 is greater than about 5 nm, and may be in the range between about 5 nm and about 20 nm. In accordance with some embodiments, dielectric capping layer 56 comprises a dielectric material selected from SiN, SiON, SiCN, SiOCN, AlON, MN, combinations thereof, and/or multi-layers thereof.

Dielectric capping layer 56 may be formed using PECVD, PEALD, ALD, HDP CVD, or similar methods. In accordance with some embodiments, dielectric capping layer 56 and dielectric protection layer 50 are formed of a same dielectric material. In accordance with alternative embodiments, dielectric capping layer 56 and dielectric protection layer 50 are formed of different materials. However, dielectric capping layer 56 and dielectric protection layer 50 have characteristics different from the characteristics of ILD1 46, so that in the subsequent etching of ILD1 46, dielectric capping layer 56 and dielectric protection layer 50 have lower etching rates than the etching rate of ILD1 46.

Figure 8:
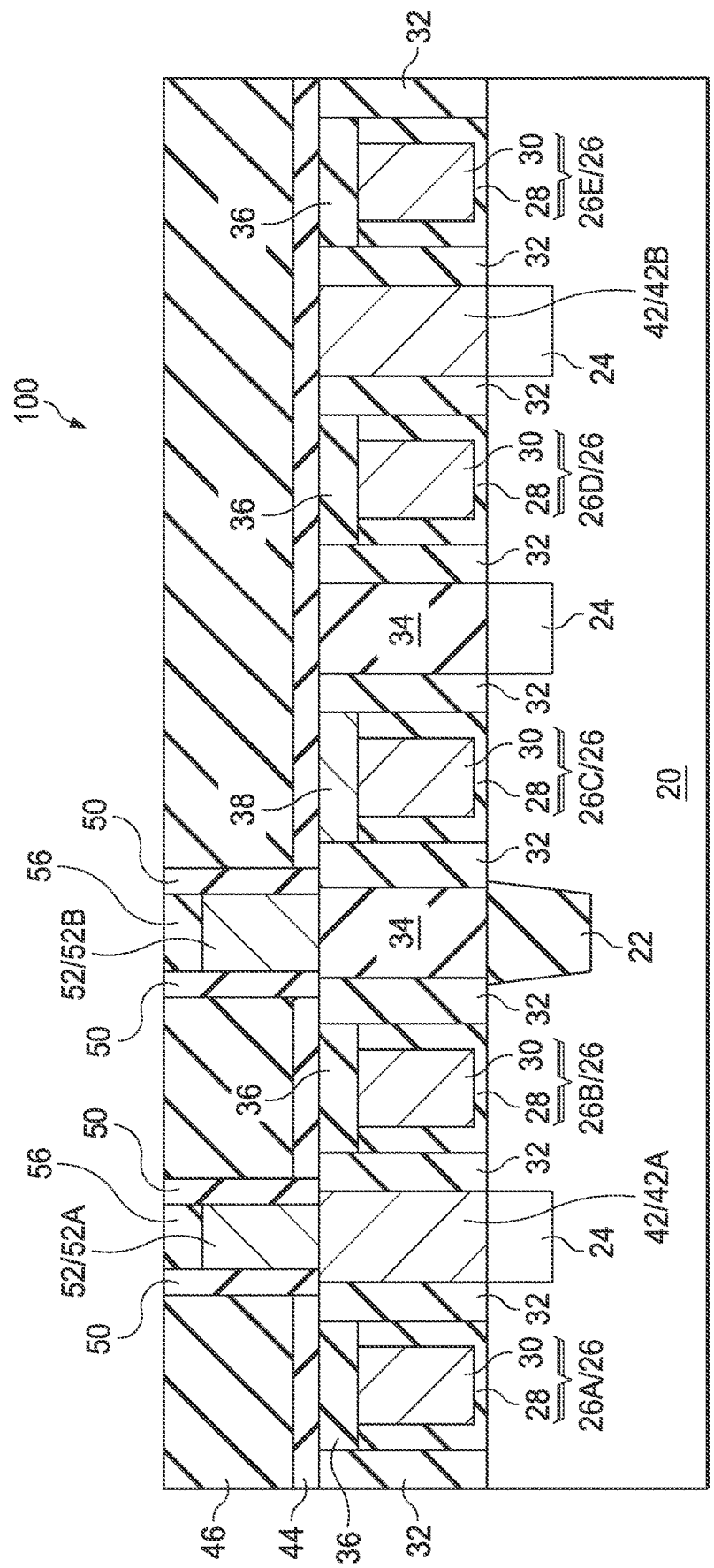

Referring again to the process step shown in FIG. 8 (step 210 in the process flow in FIG. 14), a planarization such as a CMP is performed to remove excess portions of dielectric capping layer 56, wherein the excess portions of dielectric capping layer 56 are over the top surface of ILD1 46. The top surfaces of the remaining portions of dielectric capping layer 56 are thus level with the top surface of ILD1 46. Furthermore, in accordance with some embodiments of the present disclosure, the top surfaces of the remaining portions of dielectric capping layer 56 may be level with the top edges of dielectric protection layer 50. The side edges of the remaining portions of dielectric capping layer 56 may also be aligned with the respective edges of contact plug 52B in some exemplary embodiments. Furthermore, the side edges of the remaining portions of dielectric capping layer 56 are in contact with dielectric protection layer 50.

As a result of the formation of dielectric capping layer 56 and dielectric protection layer 50, contact plug 52B is fully protected by dielectric capping layer 56 and dielectric protection layer 50 from all sidewalls and the top. Dielectric capping layer 56 and dielectric protection layer 50 in combination form an inversed basin, with contact plug 52B in the inversed basin.

As is shown in the process step in FIG. 8, contact plug 52B is formed over, and may be in contact with, ILD0 34. As also shown in FIG. 13, which is a top view, contact plugs 52 may be slot contact plugs. Contact plug 52B is used as a routing line used for interconnection purpose. The connections to the opposite ends of contact plug 52B are not shown, wherein the opposite ends of contact plug 52B may be electrically connected to source/drain (silicide) regions (not shown) and/or overlying contact plugs (not shown), which may be similar to the contact plug 64C shown in FIG. 12.

The top view of contact plugs 52A and 52B, dielectric capping layer 56, and protection layer 50 are illustrated in FIG. 13 in accordance with exemplary embodiments. As shown in FIG. 13, contact plugs 52A and 52B and dielectric capping layer 56 may be formed as slot contact plugs with lengths significantly greater than the respective widths. In alternative embodiments, plugs 52 and dielectric capping layer 56 may also have lengths close to the respective widths, and have top view shapes close to squares. Contact plugs 52A and 52B may also fully overlapped by the overlying remaining portions of dielectric capping layer 56. In accordance with some embodiments, contact plugs 52A and 52B overlap at least the respective underlying contact plugs 42A and 42B, respectively.

Figure 9:
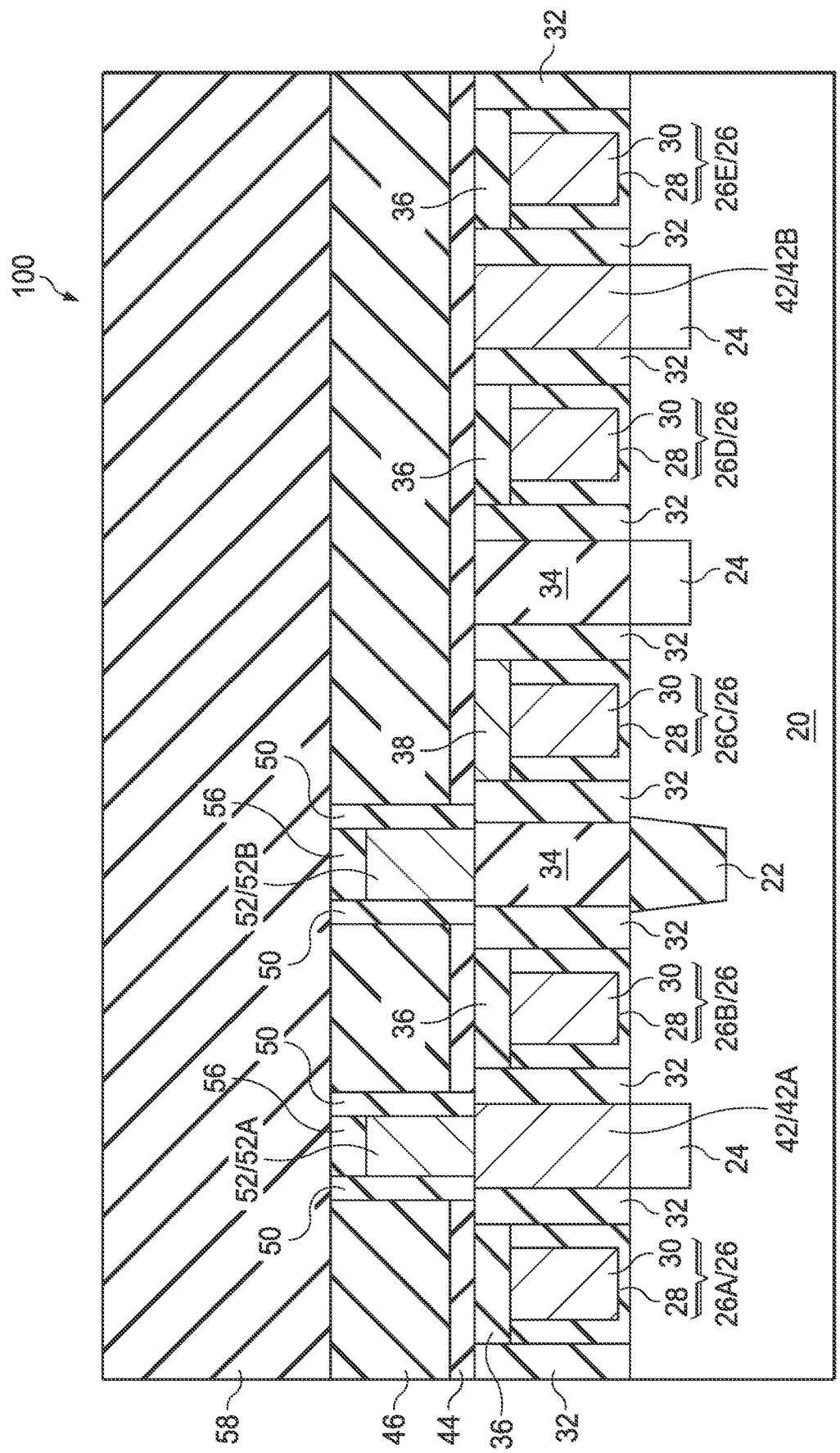

Referring to the process step shown in FIG. 9, ILD2 58 is formed. ILD2 58 may be formed using spin coating, FCVD, or the like. In alternative embodiments of the present disclosure, ILD2 58 may be formed using a deposition method such as PECVD, LPCVD, or the like. In some embodiments, ILD2 58 is over and in contact with ILD1 46. In alternative embodiments, an etch stop layer (not shown) is formed between ILD1 46 and ILD2 58. The etch stop layer, if formed, may comprise silicon carbide, silicon oxynitride, silicon carbo-nitride, or the like. ILD2 58 is formed over the etch stop layer. ILD2 58 may comprise a material selected from PSG, BSG, PBSG, FSG, TEOS, or other non-porous low-k dielectric materials. ILD2 58, ILD1 46, and ILD0 34 may be formed of a same material or different materials.

Figure 10:
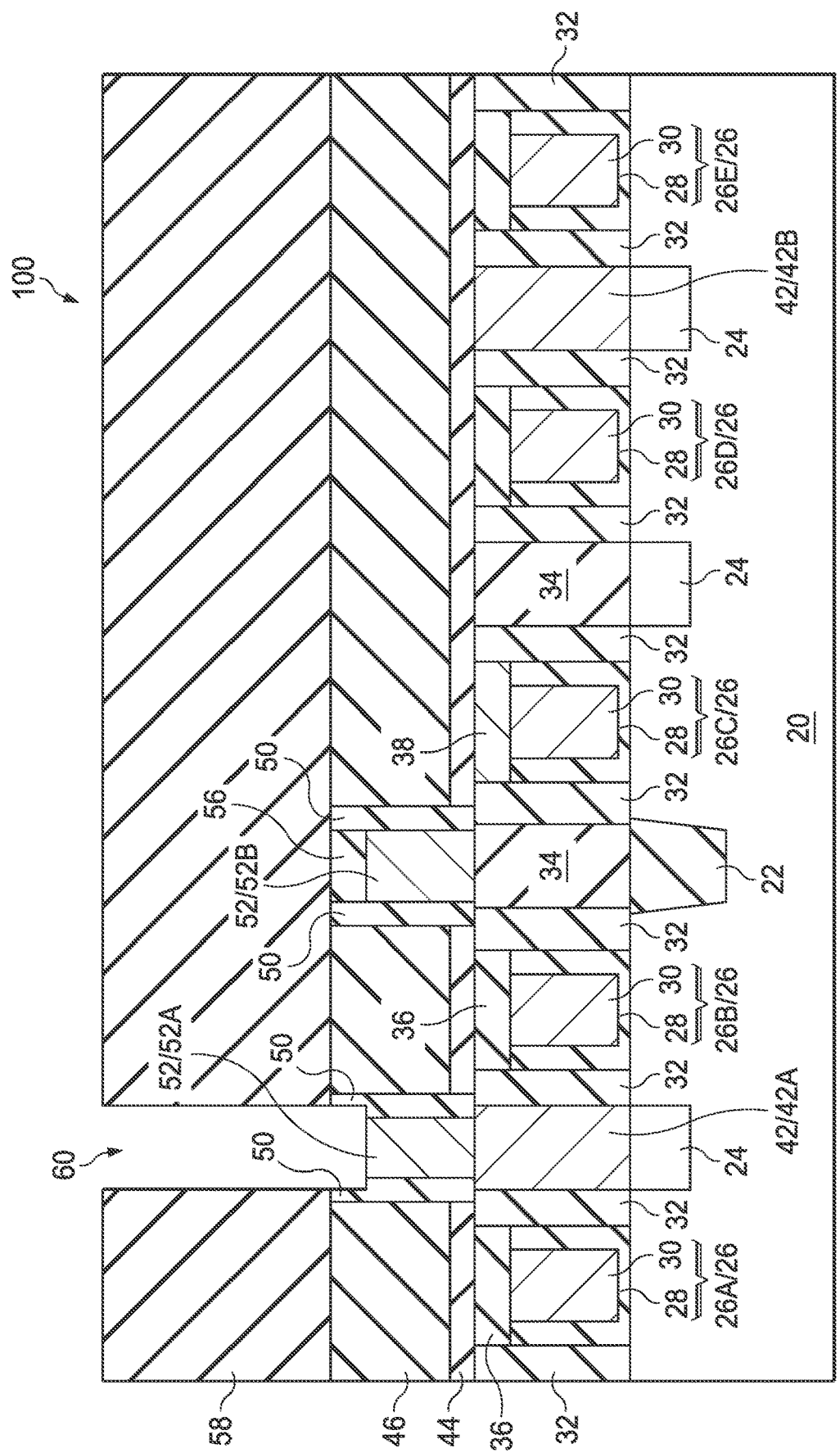

Referring to the process step shown in FIG. 10, ILD2 58 is etched to form contact opening 60. The respective step is also shown as step 212 in the process flow shown in FIG. 14. Contact opening 60 is aligned to dielectric capping layer 56 (FIG. 9) and contact plug 52A. After the etching of ILD 58, dielectric capping layer 56 is etched, and contact plug 52A is exposed. In some embodiments, the bottom of opening 60 is lower than the top edges of dielectric protection layer 50. The bottom of opening 60 may be coplanar with the top surface contact plug 52B.

Figure 11:
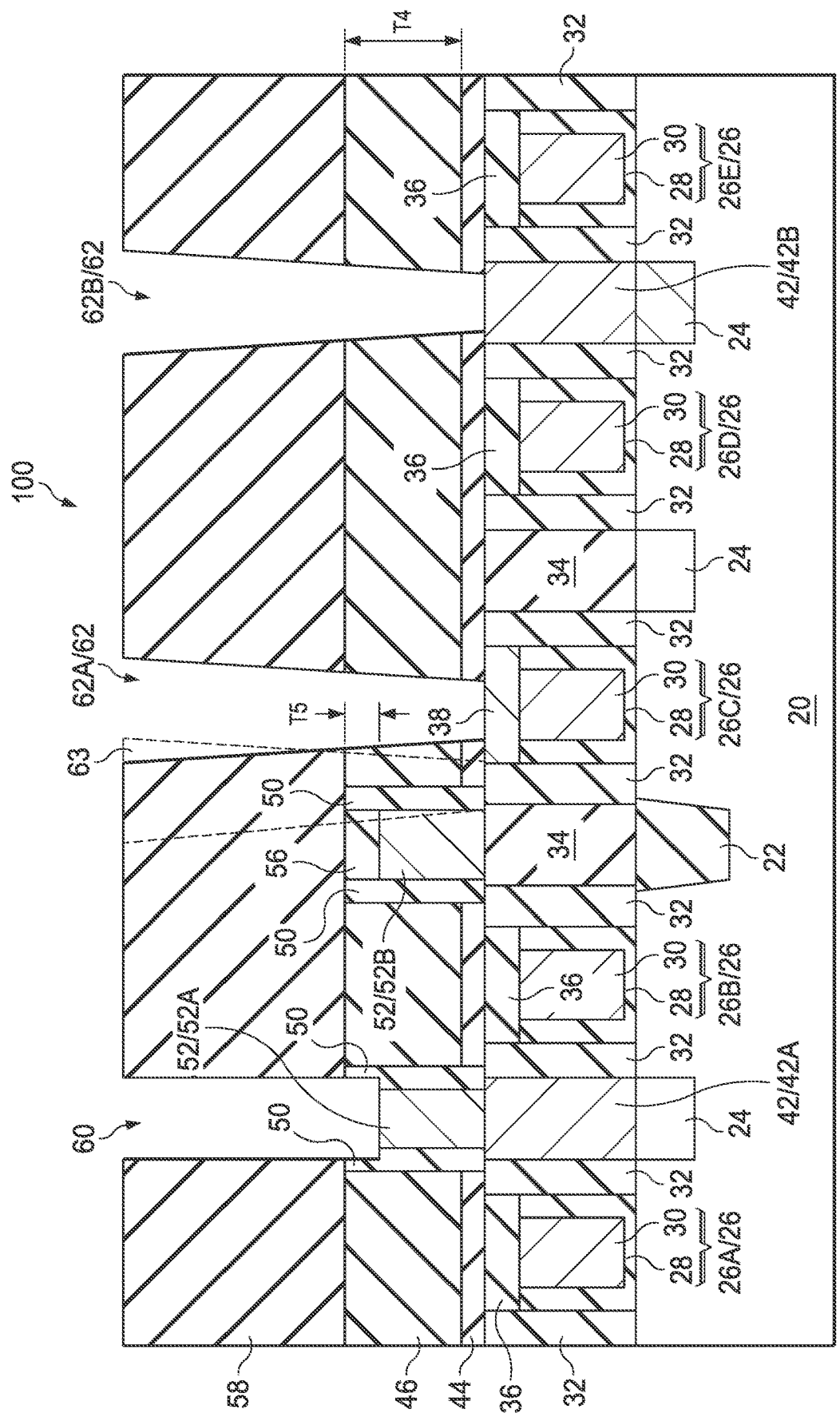

Next, referring to the process step shown in FIG. 11, an additional etching step is performed to form openings 62 in ILD2 58 and ILD1 46. The respective step is also shown as step 214 in the process flow shown in FIG. 14. In this step, the etchant is selected so that the etchant attacks ILD2 58 and ILD1 46, and does not attack dielectric capping layer 56 and dielectric protection layer 50. For example, the etching selectivity (of the etchant), which is the ratio of the etching rate of ILD2 58 and ILD1 46 to the etching rate of dielectric capping layer 56 and dielectric protection layer 50 is greater than about 10. The etching selectivity may also be greater than about 50, or greater than about 100. The desirable etching selectivity is related to the thickness T4 of ILD1 46 and the thickness T5 of dielectric capping layer 56, and is at least greater than thickness ratio T4/T5. The desirable etching selectivity may also be greater than two times the thickness ratio T4/T5. This ensures that when misalignment occurs, and opening 62A shifts to the position marked as 63, then dielectric capping layer 56 and dielectric protection layer 50 are not etched-through, and the subsequently formed contact plug 64A (FIG. 12) is not electrically shorted to contact plug 52B.

After ILD2 58 and ILD1 46 are etched, etch stop layer 44 is further etched through openings 62A and 62B to expose the underlying conductive layer 38 and contact plug 42B.

Figure 12:
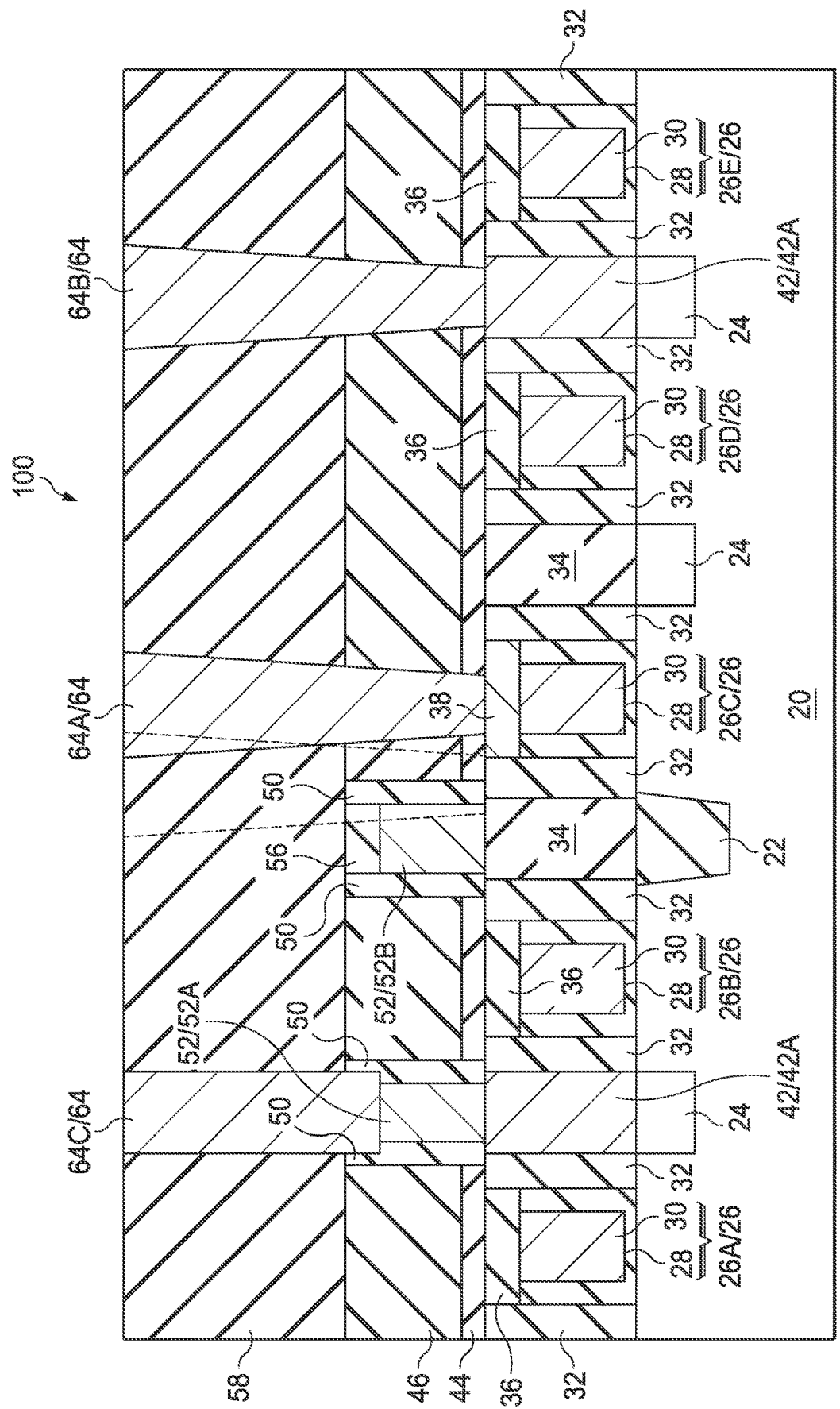

FIG. 12 illustrates the formation of contact plugs 64 (including 64A, 64B, and 64C) in openings 62A, 62B, and 60 (FIG. 11), respectively. The respective step is also shown as step 216 in the process flow shown in FIG. 14. The formation process may include filling a conductive material into openings 62A, 62B, and 60, until the top surface of the conductive material is higher than the top surface of ILD2 58, and performing a planarization such as CMP to remove excess portions of the conductive material. The remaining portions of the conductive material are contact plugs 64. As shown in FIG. 12, contact plug 64A is a gate contact plug that is electrically connected to the gate electrode 30 of gate stack 26C. Contact plug 64B is a source/drain contact plug that is electrically connected to contact plug 42B, which is further connected to the respective underlying source/drain region 24. Contact plug 64C is a source/drain contact plug that is electrically connected to contact plugs 52A and 42A, which are further connected to the respective underlying source/drain region 24.

Referring to FIG. 13, which schematically illustrates a top view of the structure shown in FIG. 12, contact plugs 64A, 64B, and 64C may have top-view shapes of non-elongated shapes such as squares, although elongated shapes may be used. Furthermore, contact plug 64A is close to contact plug 52B. Hence if a misalignment occurs, the position of contact plug 64A may undesirably shift to overlap a portion of contact plug 52B. As shown in FIG. 12, even if such misalignment occurs, in the formation of opening 62A, dielectric capping layer 56 and dielectric protection layer 50 will act as etch stop layers in the etching of ILD2 58 and ILD1 46, and dielectric capping layer 56 and dielectric protection layer 50 are not etched-through. Accordingly, when contact plug 64A is formed, as shown in FIG. 12, dielectric capping layer 56 and dielectric protection layer 50 will electrically insulate contact plug 64A from contact plug 52B, and the undesirable shorting between contact plug 64A and contact plug 52B will not occur.

As shown in FIG. 12, when the misalignment occurs, the resulting contact plug 64A as illustrated by the dashed lines will have a bottom surface 65 landing on the top edge of dielectric protection layer 50 and possibly the top surface of dielectric capping layer 56. As a comparison, if dielectric capping layer 56 and dielectric protection layer 50 are not formed, in the step shown in FIG. 12, with contact plug 64A shifts to position 63 due to misalignment, contact plug 64A and contact plug 52B will be shorted.

FIG. 14 schematically illustrates the process flow 200 for the processes in FIGS. 1 through 12. The process flow is briefly discussed herein. The details of the process flow may be found in the discussion of FIGS. 1 through 12. In step 202, contact openings 48A and 48B are formed in ILD1 46, as shown in FIG. 2. In step 204 of the process flow in FIG. 14, dielectric layer 50 is formed, and the respective formation process is illustrated in FIGS. 3 and 4. In step 206 of the process flow in FIG. 14, contact plugs 52 are formed in ILD1 46, and the respective formation process is illustrated in FIG. 5. In step 208 of the process flow in FIG. 14, contact plugs 52 are recessed to form recesses 54, and the respective formation process is illustrated in FIG. 6. In step 210 of the process flow in FIG. 14, dielectric capping layers 56 are formed to cover contact plugs 52, and the respective formation process is illustrated in FIGS. 7 and 8. In step 212 of the process flow in FIG. 14, contact opening 60 is formed, and the respective formation process is illustrated in FIG. 10. In step 214 of the process flow in FIG. 14, contact openings 62 are formed, and the respective formation process is illustrated in FIG. 11. In step 216 of the process flow in FIG. 14, contact openings 60 and 62 are filled to form contact plugs 64, and the respective formation process is illustrated in FIG. 12.

The embodiments of the present disclosure have some advantageous features. By forming the dielectric protection layer and the dielectric capping layer to protect contact plugs, even if neighboring contact plugs adjacent to the contact plugs have misalignment, the dielectric protection layer and the dielectric capping layer will remain to insulate the closely located contact plugs.

In accordance with some embodiments of the present disclosure, an integrated circuit structure includes a first ILD, a gate stack in the first ILD, a second ILD over the first ILD, a contact plug in the second ILD, and a dielectric protection layer on opposite sides of, and in contact with, the contact plug. The contact plug and the dielectric protection layer are in the second ILD. A dielectric capping layer is over and in contact with the contact plug.

In accordance with alternative embodiments of the present disclosure, an integrated circuit structure includes a first ILD, an etch stop layer over the first ILD, a second ILD over the etch stop layer, and a slot contact plug in the second ILD. The slot contact penetrates through the etch stop layer to contact a top surface of the first ILD. A dielectric protection layer includes portions on opposite sides of, and in contact with, the slot contact plug. A dielectric capping layer is over and in contact with the slot contact plug, wherein the slot contact plug, the dielectric protection layer, and the dielectric capping layer are in the second ILD.

In accordance with yet alternative embodiments of the present disclosure, a method includes forming a second ILD over a first ILD, with a gate stack located in the first ILD, etching the second ILD to form a first contact opening, forming a dielectric protection layer on opposite sidewalls of the first contact opening, and forming a first contact plug in the first contact opening, with the first contact plug being between opposite portions of the dielectric protection layer. The method further includes forming a dielectric capping layer over and the contacting the first contact plug, forming a third ILD over the second ILD, forming a second contact opening in the second ILD and the third ILD, and filling the second contact opening to form a second contact plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
   forming a first inter-layer dielectric (ILD) over a substrate and adjacent a gate stack, gate spacers being on sidewalls of the gate stack, the gate spacers being between the gate stack and the first ILD;

forming a second ILD over the first ILD;
etching the second ILD to form a first contact opening, the first contact opening exposing the first ILD and at least one of the gate spacers;
forming a dielectric protection layer on opposite sidewalls of the first contact opening;
forming a first contact plug in the first contact opening, with the first contact plug being between opposite portions of the dielectric protection layer;
etching the first contact plug to form a first recess between the opposite portions of the dielectric protection layer;
forming a dielectric capping layer in the first recess over and contacting the first contact plug, the dielectric capping layer further contacting the opposite portions of the dielectric protection layer;
forming a third ILD over the second ILD;
forming a second contact opening in the second ILD and the third ILD; and
filling the second contact opening to form a second contact plug.

2. The method of claim 1, wherein the forming the dielectric capping layer comprises:
filling the dielectric capping layer in the first recess; and
planarizing the dielectric capping layer, wherein a top surface of the dielectric capping layer is level with a top surface of the second ILD.

3. The method of claim 1, wherein forming the second contact opening exposes the dielectric protection layer.

4. The method of claim 3, wherein an etchant selected for forming the second contact opening has an etching selectivity greater than 10 for materials of the third ILD and the second ILD relative to materials of the dielectric protection layer.

5. The method of claim 1 further comprising forming an etch stop layer over the first ILD before the forming the second ILD, wherein the first contact opening penetrates through the etch stop layer.

6. The method of claim 1 further comprising forming a source/drain contact plug in the second ILD and the third ILD simultaneously when the second contact plug is formed.

7. A method comprising:
forming a gate stack with gate spacers over a semiconductor substrate;
forming a first inter-layer dielectric (ILD) over the semiconductor substrate and adjacent the gate stack and the gate spacers;
forming a second ILD over the first ILD, the gate stack, and the gate spacers;
forming a first opening in the second ILD;
forming a dielectric protection layer in the first opening, the dielectric protection layer physically contacting the first ILD and at least one of the gate spacers;
anisotropically etching the dielectric protection layer;
forming a contact plug filling the first opening;
etching back the contact plug to form a first recess;
depositing a dielectric capping layer filling the first recess; and
planarizing the dielectric capping layer, wherein a top surface of the dielectric capping layer is coplanar with a top surface of the dielectric protection layer and a top surface of the second ILD after planarizing the dielectric capping layer.

8. The method of claim 7, further comprising:
depositing a third ILD over the second ILD, the dielectric protection layer, and the dielectric capping layer; and
etching the third ILD, the dielectric protection layer, and the dielectric capping layer to form a second opening exposing a surface of the contact plug.

9. The method of claim 8, further comprising forming a second contact plug in the second opening, wherein a first width of the contact plug measured from a first sidewall of the dielectric protection layer to a second sidewall of the dielectric protection layer is greater than a second width of the second contact plug measured from a third sidewall of the dielectric protection layer to a fourth sidewall of the dielectric protection layer.

10. The method of claim 8, wherein etching the third ILD, the dielectric protection layer, and the dielectric capping layer to form the second opening removes the dielectric capping layer from a first portion of the surface of the contact plug, wherein the dielectric capping layer remains over a second portion of the surface of the contact plug.

11. The method of claim 7, wherein the dielectric protection layer and the dielectric capping layer are formed of a same material.

12. The method of claim 7, further comprising forming an etch stop layer over the semiconductor substrate before forming the second ILD, wherein the first opening is formed through the etch stop layer.

13. A method comprising:
forming a gate stack with gate spacers over a semiconductor substrate;
forming a first inter-layer dielectric (ILD) over the semiconductor substrate and surrounding the gate stack;
depositing a second ILD over the first ILD;
etching through the second ILD to form a first opening;
forming a dielectric protection layer on opposite sidewalls of the first opening, the dielectric protection layer physically contacting the first ILD and at least one of the gate spacers;
forming a first contact plug filling the first opening, the first contact plug extending between opposite inner sidewalls of the dielectric protection layer;
etching back the first contact plug to form a first recess;
forming a dielectric capping layer in the first recess, wherein the dielectric capping layer is in contact with the first contact plug, and wherein the dielectric capping layer is in contact with the opposite inner sidewalls of the dielectric protection layer;
etching through the dielectric capping layer to form a second opening exposing a top surface of the first contact plug; and
forming a second contact plug in the second opening.

14. The method of claim 13, further comprising planarizing the first contact plug, the second ILD, and the dielectric protection layer before etching back the first contact plug.

15. The method of claim 14, further comprising planarizing the dielectric capping layer, the second ILD, and the dielectric protection layer before etching through the dielectric capping layer.

16. The method of claim 13, wherein the first opening is formed with a first width, wherein the second opening is formed with a second width, and wherein the first width is greater than the second width.

17. The method of claim 16, wherein the first contact plug is formed with a third width, wherein the second contact plug is formed with the second width, and wherein the second width is greater than the third width.

18. The method of claim 13, further comprising depositing a third ILD over the second ILD, wherein the second opening is formed after depositing the third ILD over the second ILD, and wherein the second opening is formed extending through the third ILD.

19. The method of claim 15, wherein a top surface of the dielectric capping layer is coplanar with a top surface of the dielectric protection layer and a top surface of the second ILD after planarizing the dielectric capping layer, the second ILD, and the dielectric protection layer.

20. The method of claim 1, wherein the dielectric protection layer physically contacts the first ILD and at least one of the gate spacers.

* * * * *